(12) United States Patent
Lim

(10) Patent No.: US 6,316,732 B1
(45) Date of Patent: Nov. 13, 2001

(54) PRINTED CIRCUIT BOARDS WITH CAVITY AND METHOD OF PRODUCING THE SAME

(75) Inventor: Chua Ah Lim, Singapore (SG)

(73) Assignee: Gul Technologies Singapore Ltd., Singapore (SG)

( * ) Notice: Subject to any disclaimer, the term of this patent is extended or adjusted under 35 U.S.C. 154(b) by 0 days.

(21) Appl. No.: 09/420,279

(22) Filed: Oct. 18, 1999

(30) Foreign Application Priority Data

Oct. 30, 1998 (SG) .................................... 9803845-8

(51) Int. Cl.[7] ............................................. H05K 1/03
(52) U.S. Cl. ............................ 174/255; 174/259; 29/830
(58) Field of Search ............................ 174/255, 260, 174/261, 262, 263, 259; 29/840, 843, 830

(56) References Cited

U.S. PATENT DOCUMENTS

| | | | | |
|---|---|---|---|---|
| 3,795,047 | * | 3/1974 | Abolafia et al. | 29/843 |
| 4,680,075 | | 7/1987 | McNeal et al. | 156/289 |
| 4,761,335 | * | 8/1988 | Aurichio et al. | 428/352 |
| 5,719,354 | * | 2/1998 | Jester et al. | 174/255 |
| 5,842,275 | * | 12/1998 | MicMillan, II et al. | 29/840 |
| 6,066,386 | | 5/2000 | Boyko et al. | 428/209 |
| 6,090,468 | * | 7/2000 | Shimada et al. | 428/137 |
| 6,115,913 | | 9/2000 | Yamasaki et al. | 29/843 |
| 6,117,706 | | 9/2000 | Yoshioka et al. | 438/106 |
| 6,143,121 | * | 11/2000 | Suzuki | 156/272.8 |

OTHER PUBLICATIONS http://www.sematech.org/public/publications/dic/c–to–ch.htm; copyright 2000; (pp. 1–15).
http://www.sematech.org/public/publications/dic/u_and v.htm; copyright 2000; (pp. 1–6).
http://www.sematech.org/public/public/notices.htm; copyright 2000; (pp. 1–2).

* cited by examiner

Primary Examiner—Jeffrey Gaffin
Assistant Examiner—Jeremy Norris
(74) Attorney, Agent, or Firm—Conley, Rose & Tayon, P.C.

(57) ABSTRACT

A printed circuit board with at least one cavity produced by combining a dielectric core layer with an adhesive layer. The adhesive layer is a no-flow bond film without a corresponding window. Thus the bond film also act as the base of the cavity. According to one feature of the invention, a top core layer having a window is laid on top of the bond film. Since the bond film does not have a window, the tedious step of registering different windows is completely eliminated. According to a further feature of the invention, the thickness of the top core layer from where the cavity will be derived is adjusted to thicker than or the same as the depth of the cavity in the final printed circuit board.

17 Claims, 1 Drawing Sheet

PRINTED CIRCUIT BOARDS WITH CAVITY AND METHOD OF PRODUCING THE SAME

FIELD OF THE INVENTION

The present invention is related to printed circuit boards and substrates for chips and chip on board. In particular, the present invention is related to methods of producing cavities in single or multiple layer printed circuit boards or substrates.

BACKGROUND OF THE INVENTION

Printed circuit boards (PCB's), including rigid, flexible, single, double and multilayer boards have found important uses in the semi-conductor and electronic industry. In particular, PCB's with cavities are required to housing electronic devices, and to facilitate wire bonding of chips.

Conventional methods of fabricating a PCB board with a cavity involves cutting out a window in an epoxy or dielectric core layer, and another window from an adhesive or bond film. The two windows are then matched or registered before the bond film and the core layer are laminated onto a second core layer. The bond film is positioned in between the two core layers and cures during the laminating process of heating under pressure such that it acts as a fully cured epoxy-glass layer after lamination.

Two types of adhesive or bond films are available on the market. The traditional or "high flow" film, and the newer "no flow" film. The "high-flow" bond film is in a relatively uncured state before lamination, and tends to seep into the cavity during the lamination process, partially or completely filling the cavity, thus destroying the usefulness of the board. The "no-flow" type bond film will minimize seepage, but is much more expensive, and tends to trap air during the lamination process. Furthermore, due to the pre-cured nature of the material, it does not easily flow around the window edge. Thus the film may not form a good seal at the base of the cavity after lamination, even if the windows are painstakingly registered to high precision.

In order to ensure the integrity of the cavity during the lamination process, and at the same time maintain the quality of the board after lamination, techniques have been proposed which uses the high-flow bond film, such as in U.S. Pat. No. 4,680,075. Another document, U.S. Pat. No. 5,784,782, further describes a method of using a viscoplastic material which is laid over the registered windows to prevent the high flow bond film material from seeping into the cavity during lamination. These techniques, however, are still rather tedious, due to the window cutting and registering steps.

OBJECT OF THE INVENTION

It is therefore an object of the present invention to provide a method to overcome the shortcomings as stated above.

It is another object of the present invention to provide a simple and timesaving method for producing a printer circuit board with a cavity.

It is a further object to provide a printed circuit board which has a well-defined cavity.

SUMMARY OF THE INVENTION

The above objects are generally accomplished by using a low-flow bond film without a window, and to allow this layer to act as the base of the cavity. Thus, according to one feature of the invention, a top core layer having a window is laid on top of the bond film. Since the bond film does not have a window, the tedious step of registering different windows is completely eliminated. According to a further feature of the invention, the thickness of the top core layer from where the cavity will be derived is adjusted to thicker than or the same as the depth of the cavity in the final printed circuit board.

In one embodiment of the invention, the bond film without window is laid on top of a non-stick layer. The top core layer with the window corresponding to the final cavity, is laid on top of the bond film. A non-stick release film is then placed on top of the top core layer, followed by a conforming sheet. This layer structure is then laminated under heat and pressure. As the bond film is cured on top of a non-stick surface, the entire structure can subsequently be released from the non-stick surface to form a board with the cured bond film forming the bottom layer and the base of the cavity.

In another embodiment, the bond film without a window corresponding to the window in the top core layer is laid on top of a bottom core layer. The top core layer, release film and conformer sheet is then place on top of the bond film as in the previous embodiment. The product after lamination is a board with two core layers, with the bottom core layer and the cured bond film forming the base of the cavity.

DESCRIPTION OF THE INVENTION

An important aspect of the present invention is the recognition that it is not absolutely necessary to cut a window in the adhesive layer in order to produce a cavity in a PC board. The present invention teaches that a no-flow adhesive bond film may be used to form the base of a cavity in a printed circuit board, thereby eliminating the tedious step of window matching as typically performed in the art. The resultant layer structure contains a well-formed cavity with a good seal, a characteristic which has eluded those skilled in the art who have tried to use a no-flow film for this purpose. The method is cost-effective, even with the higher cost of the no-flow film, because the tedious windows matching step is eliminated. The layer structure according to the present invention is also distinguishable from others currently available in the art, as a defined layer of cured adhesive is found at the bottom of the cavity upon close examination of a traverse cross-section of the base of the cavity, for example using a microscope.

In the following description, numerous specific details are set forth such as specific conditions for lamination in order to provide a thorough understanding of the present invention. In other instances, well known elements are not described in detail in order not to unnecessarily obscure the present invention. It should be understood by one of ordinary skill in the art that a core layer refers to any dielectric material for example epoxy, which may be metallized on one or both sides. Electronic circuitry may be produced on the metallized surface before or after lamination. The bond film or adhesive layer may be of any no-flow curable adhesive commercially available and commonly used in the art for the bonding of epoxy or other dielectric layers, such as acrylic, polyimide and epoxy glass. However, a low-flow subtype is the preferred type of bond film for practicing the present invention. A "low-flow" subtype is defined in this specification as materials which gives a small amount of flow, e.g. 10 to 100 mil according to the IPC circle flow test, such as Allied Signal FR406 No-Flow B-Stage. The definition of No-flow in this specification is the same as conventional understanding, and includes the low-flow subtype mentioned above.

A release film refers to any non-stick material which conforms to the shape of the window but does not adhere to the final board, such as Teflon found in the art. A conformer sheet is any deformable material which is adaptable to conform to the shape of the window during the lamination process to prevent the adhesive material of the bond film from filling up the cavity. A suitable material is thermosetting plastic.

Figure 1:
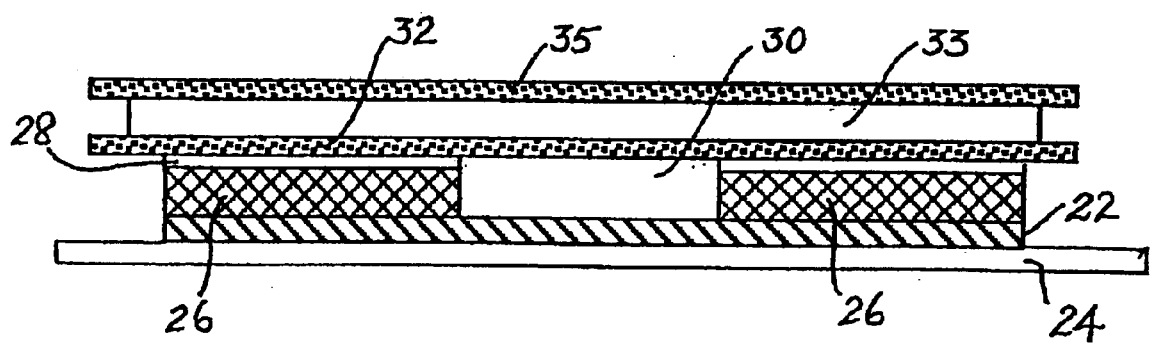
FIG. 1 is a schematic diagram to show a cross-sectional view of a printed circuit board according to the present invention on a non-stick surface.

FIG. 1 shows one embodiment of the present invention in which a simple PC board may be fabricated by placing a bond film 22 on top of a non-stick surface 24. In this example, the top core layer 26 has a metallized top surface 28. A window 30 is pre-cut in the top core layer 26 which corresponds to the final desired cavity. The thickness of this core layer is preferably the same as or slightly thicker than the desired depth of the final cavity. A release film 32 is placed on top of core layer 26 followed by a conformer sheet 33. An additional release film 35 is placed over the conformer material. This additional film is optional, and may be used, for example, if a recyclable plate or sheet is used to separate the layer structures in a stack during lamination. If a non-recyclable material is used, then the additional release film 35 is not needed. The release film is preferably a Teflon-based material of 0.001 to 0.002 inch thick. The conformer sheet is preferably a thermosetting plastic. The layer structure is then subjected to heating at a temperature of 175 to 200° C. and pressure of 300 to 400 psi. At this temperature range, the conformer sheet is deformable, and starts flowing to the cavity, resulting in a pushing force on the bond film to facilitate curing in the proper shape. After lamination, the product produced is a layer of epoxy derived from cured bond film, and a core layer with a cavity bonded on top of the cured bond film.

Figure 2:
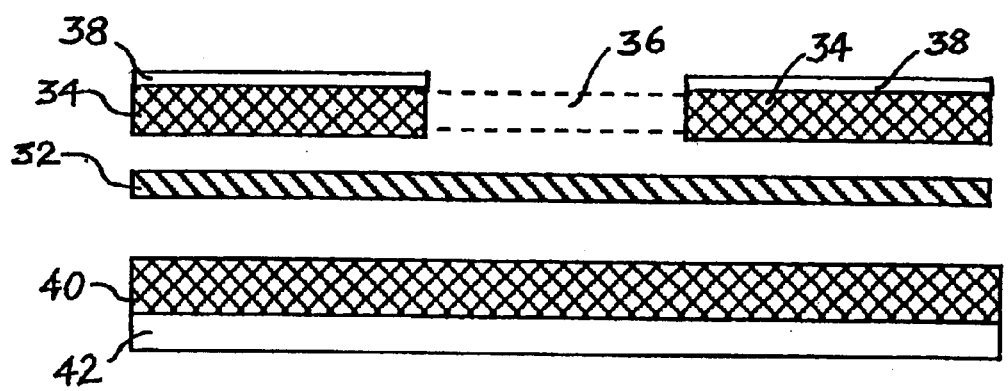
FIG. 2 is an exploded cross-sectional view of another multilayer board according to another embodiment of the present invention.

FIG. 2 shows a second embodiment of the present invention in which two core layers are bonded by a layer of bond film 32. In this example, the top core layer 34 contains a pre-cut window 36 and metallized top surface 38. The bottom core layer in this example is another epoxy layer 40 with the bottom surface metallized 42. As in FIG. 1, a release film and a conformer sheet (not shown) are laid on top of the layer structure, followed by lamination under conditions as stated in the previous embodiment. The resultant structure is a PC board with three bonded epoxy layers (the bottom core layer, the cured bond film layer and the top core layer), with a cavity of the dimension according to the top core layer window.

It is clear from the embodiments described above that numerous combinations are possible to give layer structures of various types. For example, the bottom core layer 40 may be metallized on both sides, and may itself be a multilayer structure. Top core layer 34 may also be metallized on both sides, or itself be a multilayer structure to form a PCB with multilayers. The top core layer from where the cavity is eventually derived is preferably fabricated to be slightly thicker than conventional wisdom, as conventional methods have to take into consideration the depth contributed by the bond film at the bottom of the window. For example for a cavity of 0.15 mm depth, a top core layer of 0.175 mm may be used. This is in contrast to conventional method, in which a 0.10 mm thick top core layer would be used instead to take into account the thickness contributed by the adhesive layer.

The following is a specific example to further illustrate the method according to the present invention. A cavity of 3.50 mm×4.00 mm with a cavity depth of 0.0125 mm is pre-routed or pre-punched on a dielectric core with a dielectric thickness of 0.15 mm, similar to the one shown in FIG. 1. A 0.06 mm bond film (Nelco 1080-no-flow prepreg) is placed between the top pre-punched core and a bottom core layer. A skived-PTFE of 0.025 mm is used as the release film placed above the pre-punched core. A high-flow pre-preg is used as the conformer sheet. The layer structure is placed in a vacuum-assist hydraulic press with pressure of 350 psi and temperature of 350° F. for approximately 2 hours. After the lamination process, the release materials and conformer material are removed and the board is sent for further processes, for example circuitizing.

While the present invention has been described particularly with references to FIGS. 1 and 2, it should be understood that the figures are for illustration only and should not be taken as limitation on the invention. It is contemplated that many changes and modifications may be made by one of ordinary skill in the art without departing from the spirit and the scope of the invention described.

What is claimed is:

1. A printed circuit board with at least one cavity adapted for housing an electronic device, said printed circuit board comprising a cured adhesive layer having a top and bottom surface; and a top core layer having a top and bottom surface;

the top surface of the cured adhesive bonded to the bottom surface of said top core layer, said top core layer having a window corresponding to said cavity, said cured adhesive extending across the bottom of said window and forming the base of said cavity.

2. A printed circuit board according to claim 1 wherein said top core layer further comprises at least one dielectric layer with at least one metallized surface.

3. A printed circuit board according to claim 1 wherein the adhesive layer is the no-flow type.

4. A printed circuit board according to claim 1 wherein the adhesive layer is the low-flow type.

5. A printed circuit board according to claim 1 further comprising a bottom core layer having a top and bottom surface, the top surface of said bottom core layer bonded to the bottom surface of said cured adhesive layer.

6. A printed circuit board according to claim 5 wherein said top core layer further comprises at least one dielectric layer with at least one metallized surface.

7. A printed circuit board according to claim 5 wherein said bottom core layer further comprises at least one dielectric layer with at least one metallized surface.

8. A printed circuit board according to claim 5 wherein the adhesive layer is the no-flow type.

9. A printed circuit board according to claim 5 wherein the adhesive layer is the low-flow type.

10. A method of producing a PC board with at least one cavity adapted for housing an electronic device, said method comprising:

a) laying a top core layer on a no-flow adhesive bond film, said core layer having a window for forming said cavity on said board, said bond film extending across the bottom of said window and without a window corresponding to the window of the top core layer;

b) laying a flexible release sheet above said top core layer;

c) laying a conforming sheet above said flexible release film;

d) laminating the adhesive bond film and the core layer under suitable pressure and temperature such that the conformer material flow into the window to maintain the shape of the window and the adhesive bond film bonds with the bottom surface of said top core layer and to form a cured layer at the base of the window.

11. A method according to claim 10 wherein said adhesive bond film is placed on a non-stick material for lamination.

12. A method according to claim 10 wherein a second flexible release sheet is placed above said conforming sheet before lamination.

13. A method according to claim 10 wherein the top core layer is a dielectric layer with at least one metallized surface, and masking and etching said metallized surface is performed before step (a) is performed.

14. A method according to claim 10 wherein said adhesive bond film is first laid on a bottom core layer, and the lamination step is performed to bond the bottom core layer, the adhesive bond film and the top core layer.

15. A method according to claim 14 wherein a second flexible release sheet is placed above said conforming sheet before lamination.

16. A method according to claim 14 wherein the bottom core layer is a dielectric layer with at least one metallized surface, and masking and etching said metallized surface is performed before the adhesive bond film is laid thereon.

17. A method according to claim 14 wherein said adhesive bond film is placed on a non-stick material for lamination.

* * * * *